US007543205B2

(12) United States Patent
Abhishek

(10) Patent No.: US 7,543,205 B2
(45) Date of Patent: Jun. 2, 2009

(54) CONTROL SIGNAL SYNCHRONIZATION OF A SCANNABLE STORAGE CIRCUIT

(75) Inventor: Kumar Abhishek, Delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 418 days.

(21) Appl. No.: 11/412,532

(22) Filed: Apr. 27, 2006

(65) Prior Publication Data

US 2007/0255987 A1    Nov. 1, 2007

(51) Int. Cl.
*G01R 31/28* (2006.01)
*H03K 3/289* (2006.01)

(52) U.S. Cl. .................. 714/726; 714/729; 714/731; 327/202

(58) Field of Classification Search ................ 714/726, 714/729, 731; 327/202
See application file for complete search history.

(56) References Cited

U.S. PATENT DOCUMENTS 4,495,629 A * 1/1985 Zasio et al. ................. 377/70

| 5,068,603 A | 11/1991 | Mahoney |
| 5,719,878 A * | 2/1998 | Yu et al. ................. 714/726 |
| 5,926,487 A | 7/1999 | Chappell et al. |
| 2006/0095819 A1* | 5/2006 | Bhatia ..................... 714/726 |

OTHER PUBLICATIONS

Lines, Andrew; *Asynchronous Interconnect for Synchronous SoC Design*; Micro, IEEE (online), vol. 24, No. 1, pp. 32-41. Pub. Feb. 2004 (retrieved Jul. 10, 2008)—Cited in Foreign Search Rpt.

* cited by examiner

*Primary Examiner*—Cynthia Britt
*Assistant Examiner*—John J Tabone, Jr.
(74) *Attorney, Agent, or Firm*—Dawn V. Stephens; Wade James Brady, III; Frederick J. Telecky, Jr.

(57) ABSTRACT

A system of control signal synchronization of a scannable storage circuit includes any number of storage circuits interconnected together with logic circuitry to form at least a portion of a functional circuit. Each of the storage circuits may include an input transmission gate to apply any one of a data input and a scan input to a storage element of the storage circuit based on an input circuitry that considers the state of the scan enable signal and a timing signal of a clock associated with the storage element. In addition, a control signal in a master latch of the storage element may synchronously close a hold loop in the master latch when the input transmission gate is opened upon the timing signal of the clock transitioning to a different state.

11 Claims, 3 Drawing Sheets

CONTROL SIGNAL SYNCHRONIZATION OF A SCANNABLE STORAGE CIRCUIT

FIELD OF TECHNOLOGY

This disclosure relates generally to the technical fields of electronics and digital circuit technology and, in one example embodiment, to a method and/or a system of control signal synchronization of a scannable storage circuit.

BACKGROUND

A scannable storage circuit (e.g., a standard flip-flop, a scan flip-flop, etc.) may be a clocked digital circuit capable of serving as a one-bit memory. The standard flip-flop may be operated in two states (e.g., a zero state and a one state). The standard flip-flop may include a timing signal (e.g., controlled by a clock) and a data signal at an input to the standard flip-flop. When the timing signal is turned high, a stable data (e.g., data at the input before a set-up time of the standard flip-flop) may be transferred to an output of the standard flip-flop after a clock-to-Q delay of the standard flip-flop.

A synchronous-sequential circuit (a synchronous circuit in short) may be a digital circuit (e.g., an electronic circuit based on a number of discrete voltage levels) having sub-circuits that are synchronized (e.g., operated in unison) by flip-flops (e.g., may be used to coordinate actions of two or more sub-circuits). In the synchronous circuit, a timing signal (e.g., an external signal to generate a crystal oscillator and/or a timer etc.) may be used to simultaneously trigger a chain of standard flip-flops and other logic units (e.g., a combinational circuit).

The timing signal may oscillate between a high voltage and a low voltage and the standard flip-flop may transfer data between various sub-circuits of the synchronous circuit at either a rising edge and/or a falling edge of the timing signal. For proper operation of the synchronous circuit, propagation delays may be accounted for (e.g., a set up time, a clock-to-queue delay, etc.). The propagation delays may limit a maximum frequency (e.g., speed) of the synchronous circuit. Any stable data available at the input of each standard flip-flop one set-up time before a clock-edge hits the standard flip-flop, may be stably and/or reliably transferred to the output of the standard flip-flop after one clock-to-Q delay of the standard flip-flop.

The scan flip-flop may be a variation of the standard flip-flop designed to include additional testing circuitries and/or features. Therefore, the scan flip-flop can make it easier to validate that the synchronous circuit contains no defect that could adversely affect the synchronous circuit's correct functioning. An objective of the scan flip-flop may be to make testing easier by providing a way to precisely set inputs to known values and observe the output of every scan flip-flop in the synchronous circuit.

As such, a special signal called a scan enable signal may be added to each scan flip-flop in the synchronous circuit. When the scan enable signal is asserted, an arbitrary pattern can be entered into each scan flip-flop in the synchronous circuit from an alternate input signal (e.g., a test input 'TI'), and a state of every scan flip-flop can be read out from the output (e.g., an alternate output 'TO'). When the scan enable signal is not asserted, the stable data from the standard input may be transferred to the output of the scan flip-flop.

The scan flip-flop can bring an additional delay as compared to the standard flip-flop because of added circuitry used to provide the scan enable signal to the scan flip-flop. When the scan enable signal is asserted, data available at the alternate input signal may be transferred to the output on a next clock edge.

Even when the scan flip-flop is not asserted, the additional delay can hamper performance because data bits may have to pass through additional circuitry of the scan flip-flop. This delay may reduce the maximum operating frequency of the synchronous circuit because the set-up time in the scan flop may be increased (as compared to the standard flip-flop), and therefore the stable data may need to arrive earlier to be transferable by the scan flip-flop.

SUMMARY

A method and/or a system of control signal synchronization of a scannable storage circuit is disclosed. In one aspect, a digital system includes any number of storage circuits interconnected together with logic circuitry to form at least a portion of a functional circuit, with each of the storage circuits having a scan input and an output, with the scan input of each storage circuit coupled to the output of another storage circuit to form a scan chain. Each of the storage circuits may individually include a scan enable signal to control a mode of operation (e.g., which input data stream is selected) of each of the storage circuits.

In addition, each of the storage units may include a storage element to drive at a data input and the scan input through the storage element in accordance with a state of the scan enable signal, an input transmission gate to apply any one of the data input and the scan input to the storage element based on an input circuitry that considers the state of the scan enable signal and a timing signal of a clock associated with the storage element, and a control signal of the storage element (e.g., the control signal may be associated with a loop transmission gate of the cross-coupled inverter circuit of the storage element) to synchronously close a hold loop in the storage element when the input transmission gate is opened upon the timing signal of the clock transitioning to a different state.

The storage element may include a cross-coupled inverter circuit. The synchronous closing of the hold loop in the storage element when the input transmission gate is opened may enable the functional circuit to operate at higher voltage drives including a 5 volt drive because of an alignment of arrivals of control signals associated with the input transmission gate and/or the loop transmission gate. The data input may be associated with a first physical path between the input transmission gate and the loop transmission gate, and the scan input may be associated with a second physical path between the input transmission gate and the loop transmission gate.

The input transmission gate may include an upper MOS transistor with source/drains connected to source/drains of a lower MOS transistor in a parallel manner, one pair of source/drains connected to the input circuitry and the other pair of source/drains connected to the storage element. A jam latch state of the upper MOS transistor possibly receiving conflicting signals from the input transmission gate and the loop transmission gate may be avoided through the synchronous closing of the hold loop in the storage element when the input transmission gate is opened upon the timing signal of the clock transitioning to the different state.

The synchronous closing of the hold loop in the storage element (e.g., a master latch) when the input transmission gate is opened may reduce a functional power of between 5% and 10% from other designs not having the synchronous closing. In addition, the synchronous closing of the hold loop in the storage element when the input transmission gate is opened may reduce a set-up time of each of the storage circuits by approximately 50%. The input transmission gate may be a single-stage transmission gate. Each of the storage circuits may include the single-stage transmission gate in both functional and scan paths of the storage element. At least one buffer in the storage element may minimize a skew delay when the input transmission gate is active.

The synchronous closing of the hold loop in the storage element when the input transmission gate is opened may reduce a clock power of the functional circuit by approximately 20%. Also, the input circuitry may add at most four non-critical transistors to a design in which there is no synchronous closing of the hold loop in the storage element when the input transmission gate is opened.

In another aspect, a scannable storage circuit includes a scan enable signal to control a mode of operation of the scannable storage circuit, a master latch to process any one of a data input and a scan input based on a state of the scan enable signal. The master latch may have a loop transmission gate to synchronously close a hold loop in the master latch when an input transmission gate is opened upon a timing signal of a clock transitioning to a different state. A status of the loop transmission gate and/or the input transmission gate may be based on an input circuitry that considers a state of the scan enable signal and the timing signal of the clock.

In addition, a slave latch may be coupled to the master latch to receive an output of the master latch based on the timing signal of the clock associated with the scannable storage circuit. The data input may be associated with a first physical path between the input transmission gate and the loop transmission gate. The scan input may be associated with a second physical path between the input transmission gate the loop transmission gate.

In yet another aspect, a method may include applying any one of a data input and a scan input to a storage element based on a input circuitry that considers a state of a scan enable signal and a timing signal of a clock associated with the storage element, and synchronously closing a hold loop in the storage element when an input transmission gate is opened upon the timing signal of the clock transitioning to a different state.

In addition, a functional power, a set-up time, and a clock power of the storage element may be reduced by synchronously closing the hold loop in the storage element when the input transmission gate is opened upon the timing signal of the clock transitioning to the different state. A first physical path of the data input may be separated from a second physical path of the scan input to minimize a diffusion capacitance of the storage element.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Figure 1:
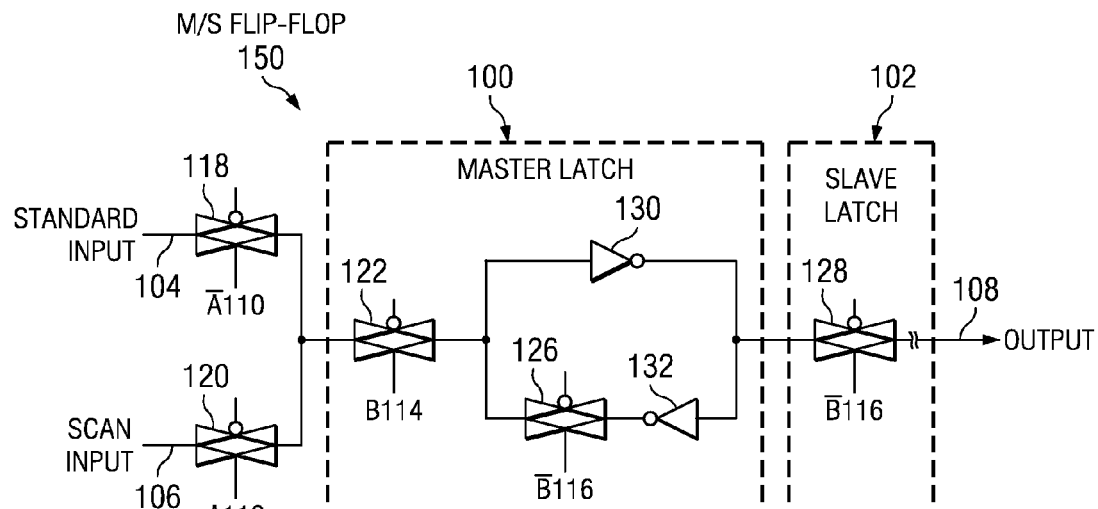
FIG. 1 is a circuit diagram of a master/slave flip-flop having multiple-stages of input transmission gates before a master latch, according to one embodiment.

Other features of the present embodiments will be apparent from the accompanying drawings and from the detailed description that follows.

DETAILED DESCRIPTION

A method and/or a system of control signal synchronization of a scannable storage circuit is disclosed. In the following description, for the purposes of explanation, numerous specific details are set forth in order to provide a thorough understanding of the various embodiments. It will be evident, however to one skilled in the art that the various embodiments may be practiced without these specific details.

In one embodiment, a digital system includes any number of storage circuits (e.g., any number of a master/slave flip-flop 350 of FIG. 3) interconnected together with logic circuitry to form at least a portion of a functional circuit, with each of the storage circuits having a scan input (e.g., a scan input 106 of FIGS. 1-3) and an output (e.g., an output 108 of FIGS. 1-3), with the scan input of each storage circuit coupled to the output of another storage circuit to form a scan chain. Each of the storage circuits may individually include a scan enable signal (e.g., 'A' of FIGS. 1-3) to control a mode of operation (e.g., which input data stream is selected) of each of the storage circuits.

In addition, each of the storage units may include a storage element (e.g., a master latch 300 of FIG. 3) to drive a data input and the scan input through the storage element in accordance with a state of the scan enable signal. The storage element may also includes an input transmission gate (as described in FIG. 3) to apply any one of the data input and the scan input to the storage element based on an input circuitry that considers the state of the scan enable signal and a timing signal of a clock (e.g., 'B' of FIGS. 1-3) associated with the storage element. Furthermore, the storage element may include a loop transmission gate in a master latch of the storage element (e.g., a control signal may be associated with the loop transmission gate formed with a cross-coupled inverter circuit of the master latch) to synchronously close a hold loop in the master latch when the input transmission gate is opened upon the timing signal of the clock transitioning to a different state.

In another embodiment, a scannable storage circuit (e.g., the master/slave flip-flop 350 of FIG. 3) includes a scan enable signal to control a mode of operation of the scannable storage circuit, a master latch to process any one of a data input and a scan input based on a state of the scan enable signal. The master latch (e.g., the master latch 300 of FIG. 3) may have a loop transmission gate (e.g., a loop transmission gate 326 of FIG. 3) to synchronously close a hold loop in the master latch when an input transmission gate (e.g., an input transmission gate 322 of FIG. 3) is opened upon a timing signal of a clock transitioning to a different state. A status of the loop transmission gate and/or the input transmission gate may be based on an input circuitry that considers the state of the scan enable signal and the timing signal of the clock (as described in FIG. 3).

Figure 2:
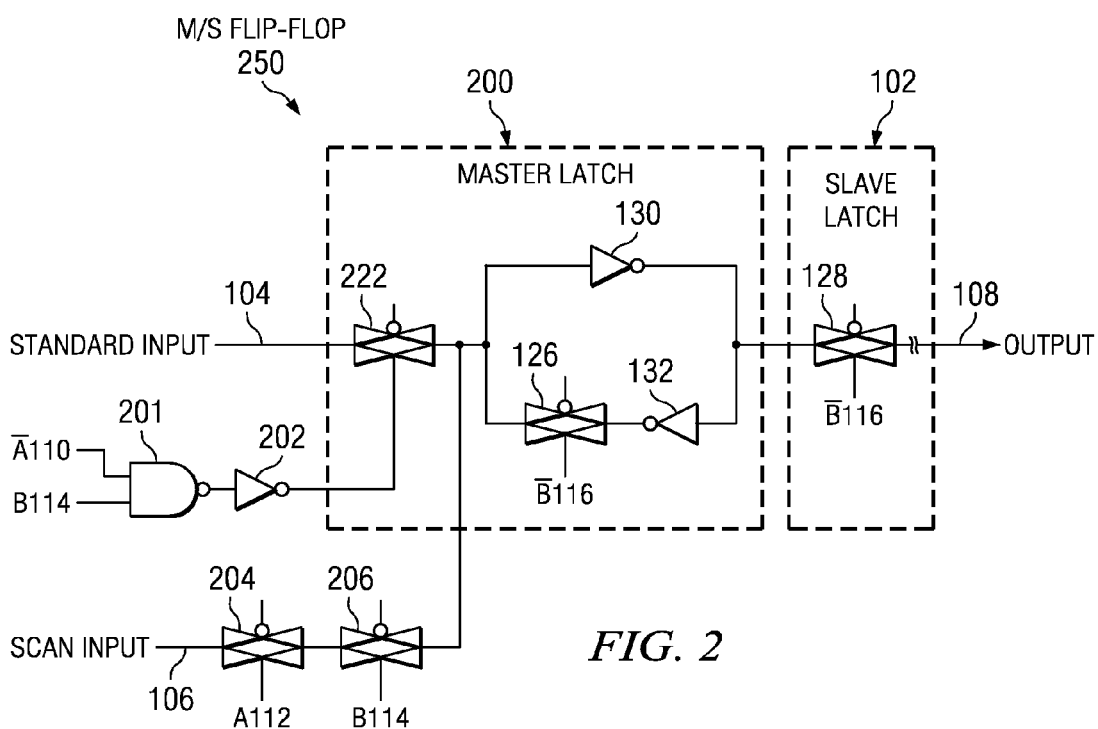
FIG. 2 is a circuit diagram of a master/slave flip-flop having a single-stage of an input transmission gate before a master latch, according to one embodiment.
Figure 3:
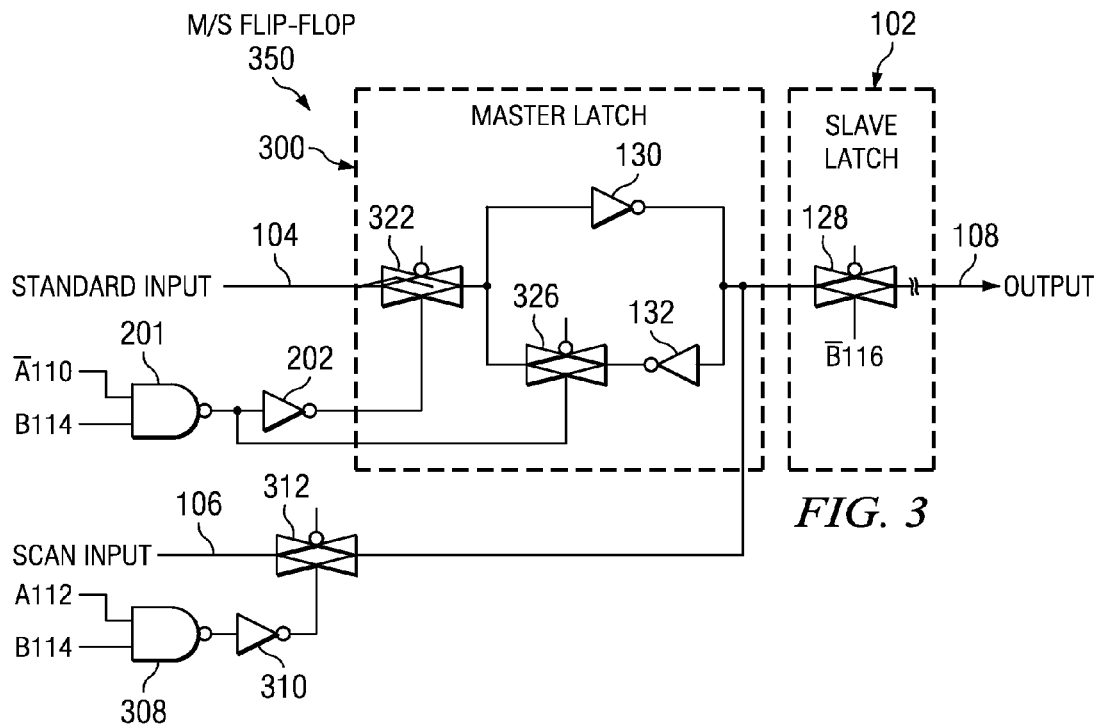
FIG. 3 is a circuit diagram of a master/slave flip-flop having a single-stage of an input transmission gate before a master latch and a synchronized control signal of a loop transmission gate of the master latch, according to one embodiment.

In yet another embodiment, a method may include applying any one of a data input and a scan input to a storage element based on a input circuitry that considers a state of a scan enable signal and a timing signal of a clock associated with the storage element, and synchronously closing a hold loop in the storage element when an input transmission gate is opened upon the timing signal of the clock transitioning to a different state (e.g., as described in FIG. 2 and in FIG. 3).

FIG. 1 is a circuit diagram of a master/slave flip-flop 150 (e.g., a scannable storage circuit, the scan flip-flop, etc.) having multiple-stages of input transmission gates (e.g., an input transmission gate 118, an input transmission gate 120, and an input transmission gate 122) before a master latch 100, according to one embodiment. The master/slave flip-flop 150 includes the master latch 100 and the slave latch 102.

When a scan enable signal 'A' is in a high state (e.g., as reflected by 'A112' in FIG. 1), a control signal of the input transmission gate 120 may be enabled and data may be received from a scan input 106 (e.g., a test input). In one embodiment, the scan enable signal 'A' in each of the scannable storage circuits (e.g., the master/slave flip-flops forming the synchronous circuit) may control a mode of operation of each of the storage circuits (e.g., the master/slave flip-flop 150).

Conversely, an input transmission gate 118 may be disabled and data may be blocked from a standard input 104 (e.g., a data input) when the scan enable signal 'A' is in the high state because a control signal of the input transmission gate 118 may be in a low state. As such, an input transmission gate 122 may receive data only from the scan input 106 when the scan enable signal 'A' is in the high state.

When the scan enable signal 'A' is in a low state, the control signal (e.g., as reflected by 'NOT A110' in FIG. 1) of the input transmission gate 118 may be enabled and data may be received from the standard input 104 (e.g., the data input). Conversely, the input transmission gate 120 may be disabled and data may be blocked from the scan input 106 (e.g., a test input) when the scan enable signal 'A' is in the low state because the control signal of the input transmission gate 120 may be in the low state. As such, the input transmission gate 118 may receive data only from the standard input 104 when the scan enable signal 'A' is in the low state.

Either the standard input 104 data or the scan input 106 data may be received into the master latch 100 through the input transmission gate 122. A control signal to the input transmission gate 122 may be clocked by a timing signal 'B' at a level triggered interval, according to one embodiment. For example, as illustrated in FIG. 1, the input transmission gate 122 to the master latch 100 is activated when the timing signal 'B' is in a high state (e.g., as reflected by B114).

When data is transferred through the master latch 100 and when the data arrives at an output of the master latch 100, it may be transferred through a slave latch 102 when the timing signal 'B' is in a low state (e.g., as reflected by NOT B116). Thus, the master latch 100 and the slave latch 102 may operate in unison as a master/slave flip-flop 150 (e.g., edge-triggered because both the master latch 100 and/or the slave latch 102 may be level triggered at offset to each other). For example, an input data (e.g., the standard input 104 and/or the scan input 106) may be transferred as the output 108 (e.g., there may be separate outputs for a data path and a scan path) through the slave latch 102. In one embodiment, the master/slave flip-flop 150 (e.g., edge-triggered) may include a storage element (e.g., the master latch 100, the slave latch 102, etc.) to drive at least one of a data input (e.g., the standard input 104) and the scan input 106 through the storage element in accordance with a state of the scan enable signal (e.g., the scan enable signal 'A').

A loop is illustrated in FIG. 1 inside the master latch 100. Particularly, the loop includes two cross-coupled inverters (e.g., an inverter 130 and an inverter 132) connected in series with a loop transmission gate 126. A control signal to the loop transmission gate 126 is illustrated as being clocked by the timing signal 'B' in a low state (e.g., as reflected by B116). As such, when the input transmission gate 122 is enabled (e.g., the timing signal 'B' in a high state, such as the high state B114 as illustrated in FIG. 1), the loop transmission gate 126 may be disabled.

When the input transmission gate 122 is disabled, the loop transmission gate 126 may be enabled (e.g., the timing signal 'B' in a low state, such as the low state NOT B116 as illustrated in FIG. 1). This design may allow a data state to be maintained in the loop of FIG. 1 when data (e.g., the standard input 104 and/or the scan input 106) are not received into the master latch 100 (e.g., when the input transmission gate 122 is disabled because the timing signal 'B' is in the low state).

FIG. 2 is a circuit diagram of a master/slave flip-flop 250 having a single-stage of an input transmission gate 222 before a master latch 200, according to one embodiment. In FIG. 2, a control signal of the input transmission gate 222 is operated by an input circuitry that considers a state of the scan enable signal (e.g., the scan enable signal 'A') and the timing signal (e.g., the timing signal 'B') of a clock associated with the storage element (e.g., the master latch 200).

The input circuitry is illustrated in FIG. 2 as including a NAND gate 201 coupled to an inverter 202 in a first path. In addition, the scan input 106 is illustrated as directly connected to the loop (e.g., the loop formed by the inverter 130, the inverter 132, and the loop transmission gate 126) through a transmission gate 204 and a transmission gate 206 in a second path. The first path may be used for enabling the standard input (e.g., the scan enable signal low 'NOT A10', the timing signal high 'B114'). The second path may be used for enabling the scan input (e.g., the scan enable signal high 'A112', the timing signal high 'B114'). As such, only one of the standard input 104 and the scan input 106 is enabled to the input transmission gate 222 at one time.

FIG. 3 is a circuit diagram of a master/slave flip-flop 350 having a single-stage of an input transmission gate (e.g., the input transmission gate 322) before a master latch 300 and a synchronized control signal of a loop transmission gate (e.g., the loop transmission gate 326) of the master latch 300, according to one embodiment. The scan input 106 may be processed through an input transmission gate 312. In addition, in FIG. 3, the input circuitry is illustrated as including a third path that extends from the output of the NAND gate 201 directly to the loop transmission gate 326. The third path may be used to align a control path of the loop transmission gate 326.

The input transmission gate 312 may be active when a clock is at a high signal ('B114') and when a scan enable signal is active ('A112'). The clock and the scan enable signal pass through a NAND gate 308 and an inverter 310 before arriving at the input transmission gate 312, according to the embodiment illustrated in FIG. 3. The input transmission gate 312 is coupled (e.g., connected) to an opposite side of the loop (e.g., formed by the inverter 130, the inverter 132, and the loop transmission gate 326).

In one embodiment, the timings of the control path to the loop transmission gate 326 may be aligned with the timing of a control path to the input transmission gate 312 or input transmission gate 322 (depending on whether a scan input or a data input is selected). As such, delays to both the input transmission gate 322 and the loop transmission gate 326 may be nearly the same when delay is minimized in the inverter 202. The delay of the inverter 202 may be minimized by increasing a physical size of transistors forming the inverter 202. In alternate embodiments, other approaches may be possible to align the timing of the paths (e.g., lengthening the wire between the loop transmission gate 326 and the NAND gate 201, adding additional delay in the path between the loop transmission gate 326 and the NAND gate 201 by having similar circuitry, delay timings, etc.). Therefore, a control signal in the master latch 300 (e.g., the master latch 300 may be a storage element and/or may be a component of a larger size storage element) may synchronously close a hold loop (e.g., formed by the inverter 130, the inverter 132, and the loop transmission gate 326) in the master latch 300 when the input transmission gate 322 is opened upon the timing signal 'B' of a clock transitioning to a different state (e.g., B114 and/or NOT B116).

The storage element (e.g., the master latch 300) may include a cross-coupled inverter circuit (e.g., the inverter 130 and the inverter 132). In one embodiment, synchronous closing of the hold loop (e.g., as formed by the inverter 130, the inverter 132, and the loop transmission gate 326) enables the functional circuit to operate at higher voltage drives including a 5 volt drive when the input transmission gate 322 of FIG. 3 is opened (e.g., because of an alignment of arrivals of control signals associated with the input transmission gate 322 and the loop transmission gate 326).

In another embodiment, the standard input 104 (e.g., the data input) of FIG. 3 is associated with a first physical path between the input transmission gate and the loop transmission gate (e.g., as illustrated by a first connection path inside the master latch 300 between the input transmission gate 322 and the hold loop), and the scan input 106 is associated with a second physical path between the input transmission gate and the loop transmission gate (e.g., as illustrated by a second connection path inside the master latch 300 between the input transmission gate 312 and the hold loop).

A jam latch state (e.g., conflicting data signals being received causing a stall and/or a delay) of the inverter 130 (e.g., an upper MOS transistor) possibly receiving conflicting signals from the input transmission gate 322 and the loop transmission gate 326 may be avoided through the synchronous closing of the hold loop in the master latch 300 when the input transmission gate 322 is opened upon the timing signal 'B' of the clock transitioning to the different state (e.g., B114 and/or B116). In addition, the synchronous closing of the hold loop in the master latch 300 when the input transmission gate 322 is opened may reduce a functional power of between 5% and 10% from other designs not having the synchronous closing (e.g., because extra power may be required to escape the jam latch state).

As such, the synchronous closing of the hold loop in the master latch 300 when the input transmission gate 322 is opened may reduce a set-up time of the master/slave flip-flop 350 (e.g., a storage circuit) by approximately 50% (e.g., because the delay caused by the jam latch state is avoided by aligning the control signals of the input transmission gate 322 and the loop transmission gate 326). The input transmission gate 322 is illustrated as being a single-stage transmission gate in FIG. 3, because only one input transmission gate (e.g., the input transmission gate 312 or the input transmission gate 322) is required between the standard input 104 and/or the scan input 106 and the hold loop of the master latch 300.

In the embodiment illustrated in FIG. 2 and in FIG. 3, a single-stage transmission gate is shown in both functional (e.g., the standard input 104 path) and scan path (e.g., the scan input 106 path) of the storage element. In addition, synchronous closing of the hold loop in the master latch 300 when the input transmission gate is opened may reduce the clock power of the functional circuit by approximately 20% (e.g., because a separate clock is not required to power the control signal of the loop transmission gate 326, and the clock of the input transmission gate 322 is inverted but shared with the loop transmission gate 326).

Figure 4:
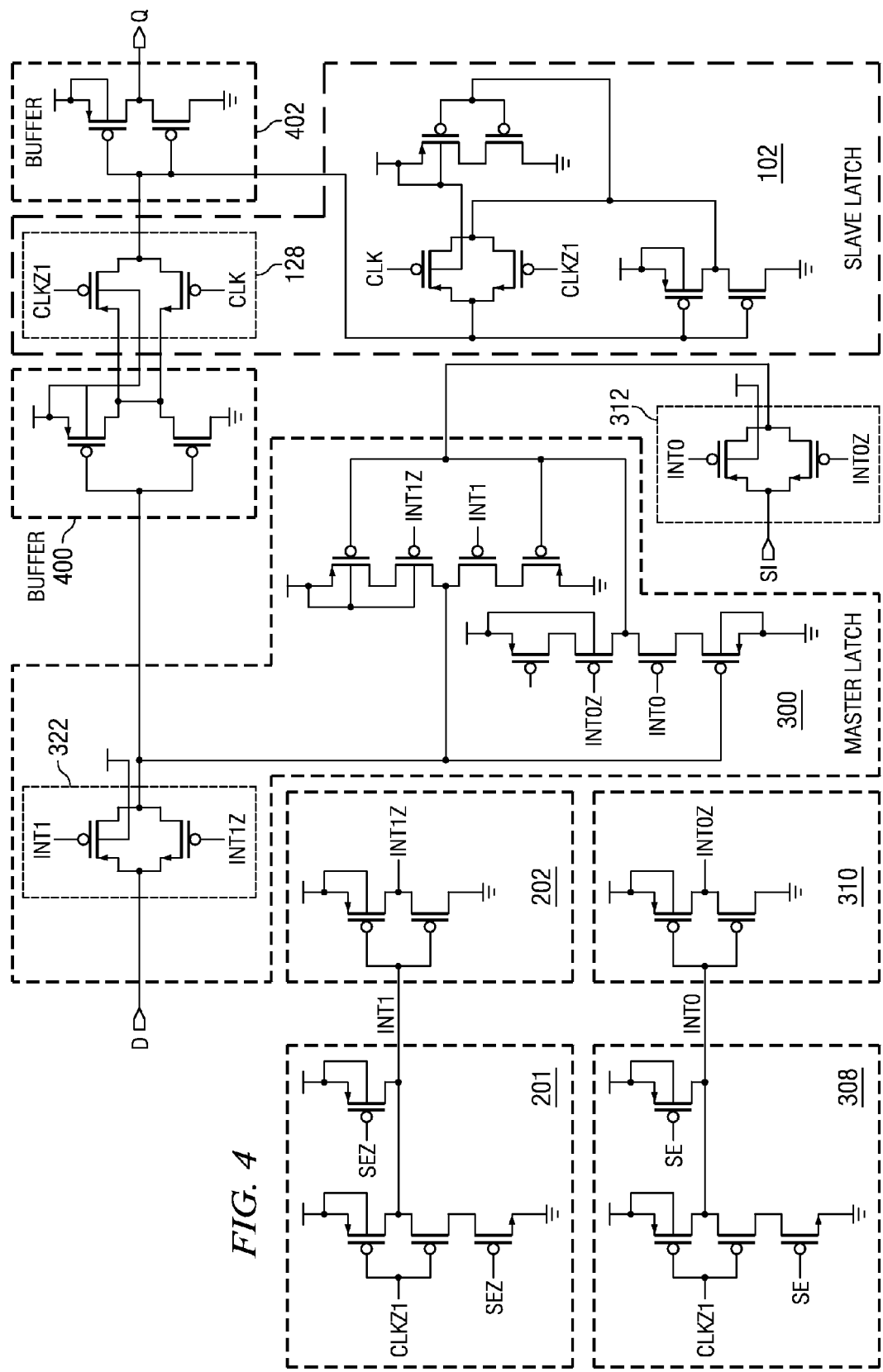
FIG. 4 is a transistor level exploded view diagram of the master/slave flip-flop of FIG. 3, according to one embodiment.

FIG. 4 is a transistor level exploded view diagram of the master/slave flip-flop of FIG. 3, according to one embodiment. FIG. 4 illustrates a transistor-level circuitry forming the NAND gate 201, the inverter 202, the NAND gate 308, and the inverter 310 of FIG. 2 and FIG. 3. Furthermore, FIG. 4 illustrates a transistor-level circuitry forming the input transmission gate 322 and the master latch 300 of FIG. 3. In addition, FIG. 4 illustrates the transistor level logic circuitry forming an input transmission gate 128 to the slave latch 102 as illustrated in FIGS. 1-3. In addition, the input transmission gate 312 is illustrated in FIG. 4. For example, FIG. 4 illustrates the input transmission gate 128 and the input transmission gate 312 as including an upper MOS transistor with source/drains connected to source/drains of a lower MOS transistor in a parallel manner (e.g., one pair of source/drains may be connected to the input circuitry and the other pair of source/drains connected to the master latch).

In addition, FIG. 4 illustrates a buffer 400 and a buffer 402. The buffer 400 and the buffer 402 may be between the master latch 300 and the slave latch 102 as illustrated in FIG. 4 to reduce the effect of a skew to a signal (e.g., the standard input 104 and/or the scan input 106) being passed through the master latch 300 (e.g., when the input transmission gate 322 is active). In alternate embodiments, there may be additional buffers in the transistor level logic circuitry to rectify and/or stabilize various signals. In one embodiment, the transistor level circuitry of the master/slave flip-flop 350 of FIG. 3 as illustrated in FIG. 4 adds at most four non-critical transistors to a design than one in which there is no synchronous closing of the hold loop in the master latch 300 when the input transmission gate 322 is opened.

Figure 5:
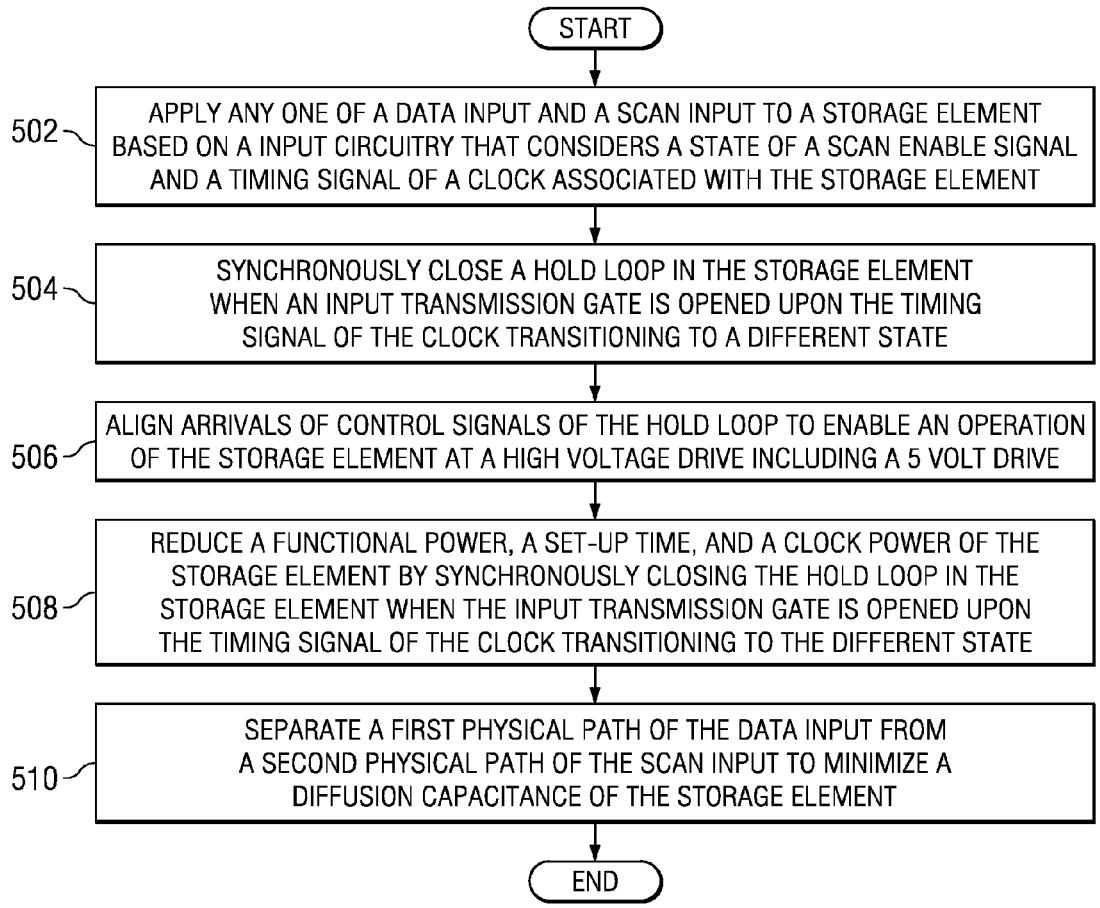
FIG. 5 is a process flow of synchronously closing a hold loop in a storage element when an input transmission gate is opened upon a timing signal of a clock transitioning to a different state, according to one embodiment.

FIG. 5 is a process flow of synchronously closing a hold loop in a storage element when an input transmission gate is opened upon a timing signal of a clock transitioning to a different state, according to one embodiment. In operation 502, any one of a data input (e.g., the standard input 104 of FIGS. 1-3) and a scan input (e.g., the scan input 106 of FIGS. 1-3) may be applied to a storage element (e.g., the master latch 300 of FIG. 3) based on an input circuitry (e.g., as described in FIG. 2 and FIG. 3) that considers a state of a scan enable signal (e.g., the scan enable signal 'A') and the timing signal (e.g., the timing signal 'B') of FIGS. 1-3 of the clock associated with the storage element (e.g., the master latch 300). In operation 504, a hold loop may be synchronously closed in the storage element when an input transmission gate (e.g., the input transmission gate 322 of FIG. 3) is opened upon the timing signal of the clock transitioning to a different state.

Then, in operation 506, arrivals of control signals of the hold loop may be aligned (e.g., the control signals of the input transmission gate 322 and the loop transmission gate 326 may be aligned) to enable an operation of the storage element at a high-voltage drive including a 5 volt drive (e.g., because there is no delay between skews). In operation 508, a functional power, a set-up time, and a clock power of the storage element may be reduced by synchronously closing the hold loop in the storage element when the input transmission gate is opened upon the timing signal of the clock transitioning to the different state (e.g., because of properties of the design as described in FIG. 2 and FIG. 3). For example, the functional power may be reduced by approximately 5% to 10%, the set-up time may be reduced by approximately 50%, and/or the clock power may be reduced by approximately 20% from a design not having the synchronous closing of the hold loop in the storage element (e.g., as described in FIG. 3). Then, in operation 510, a first physical path of the data input may be separated from a second physical path of the scan input to minimize a diffusion capacitance of the storage element (e.g., as described in FIG. 3).

It should be noted that in one embodiment, the master/slave flip-flop 150 as illustrated in FIG. 1, the master/slave flip-flop 250 as illustrated in FIG. 2, and/or the master/slave flip-flop 350 as illustrated in FIG. 3 may be embodied using two or more storage circuits interconnected together with logic circuitry to form at least a portion of a functional circuit (e.g., an Application Specific Integrated Circuit 'ASIC', a Digital Signal Processor 'DSP', etc.). Each of the storage circuits may have a scan input (e.g., the scan input 106 of FIGS. 1-3) and an output (e.g., the output 108 of FIGS. 1-3), with the scan input of each storage circuit coupled to the output of another storage circuit to form a scan chain (e.g., a partial scan chain, a multiple scan chain, a test compression scan chain, etc.).

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A digital system, comprising:
    a storage element to drive at least one of a data input and a scan input through the storage element in accordance with a state of a scan enable signal and a timing signal of a clock associated with the storage element, the storage element having a hold loop;
    a standard input transmission gate to apply the data input to the storage element based on a first input circuitry that considers the state of the scan enable signal and the timing signal of the clock associated with the storage element, the standard input transmission gate coupled to a first end of the hold loop;
    a scan input transmission gate to apply the scan input to the storage element based on a second input circuitry that considers the state of the scan enable signal and the timing signal of the clock associated with the storage element, the scan input transmission gate coupled to a second end of the hold loon; and
    a loop transmission gate in the storage element to synchronously close the hold loop in the storage element when the standard input transmission gate is opened upon the timing signal of the clock transitioning to a different state, wherein the loon transmission gate is controlled by the first input circuitry based on a predefined state of the scan enable signal and the timing signal of the clock.

2. The digital system of claim 1 wherein the storage element comprises a cross-coupled inverter circuit, and wherein a control signal is associated with the loop transmission gate of the cross-coupled inverter circuit.

3. The digital system of claim 2 wherein synchronous closing of the hold loop in the storage element when the input transmission gate is opened enables the digital system to operate at higher voltage drives including a 5 volt drive because of an alignment of arrivals of control signals associated with the standard input transmission gate, the scan input transmission gate, and the loop transmission gate.

4. The digital system of claim 2 wherein the data input is associated with a first physical path between the standard input transmission gate and the loop transmission gate, and the scan input is associated with a second physical path between the scan input transmission gate and the loop transmission gate.

5. The digital system of claim 2 wherein the standard input transmission gate further comprises an upper MOS transistor with source/drains connected to source/drains of a lower MOS transistor in a parallel manner, with one pair of source/drains connected to the input circuitry and the other pair of source/drains connected to the storage element.

6. The digital system of claim 5 wherein a jam latch state of the upper MOS transistor created when receiving conflicting signals from the standard input transmission gate or the scan input transmission gate and the loop transmission gate is avoided through the synchronous closing of the hold loop in the storage element when the standard input transmission gate or the scan input transmission gate is opened upon the timing signal of the clock transitioning to the different state.

7. The digital system of claim 6 wherein the synchronous closing of the hold loop in the storage element when the standard input transmission gate or the scan input transmission gate is opened reduces a functional power of between 5% and 10% from other designs not having the synchronous closing.

8. The digital system of claim 1 wherein synchronous closing of the hold loop in the storage element when the standard input transmission gate or the scan input transmission gate is opened reduces a set-up time of each of the storage circuits by approximately 50%.

9. The digital system of claim 1 wherein the standard input transmission gate and the scan input transmission gate are single-stage transmission gates.

10. The digital system of claim 1 further comprising at least one buffer in the storage element to minimize a skew delay when the standard input transmission gate or the scan input transmission gate is active.

11. The digital system of claim 1 wherein synchronous closing of the hold loop in the storage element when the standard input transmission gate or the scan input transmission gate is opened reduces a clock power of the functional circuit by approximately 20%.

* * * * *